(12) United States Patent
May

(10) Patent No.: US 7,394,314 B2
(45) Date of Patent: Jul. 1, 2008

(54) CLASS-D AMPLIFIER WITH NOISE-IMMUNITY FEEDBACK

(75) Inventor: Marcus W. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 110 days.

(21) Appl. No.: 11/325,121

(22) Filed: Jan. 4, 2006

(65) Prior Publication Data
US 2006/0152281 A1    Jul. 13, 2006

Related U.S. Application Data

(60) Provisional application No. 60/643,543, filed on Jan. 13, 2005.

(51) Int. Cl.
*H03F 3/217* (2006.01)
(52) U.S. Cl. .................... 330/251; 330/207 A
(58) Field of Classification Search ............ 330/10, 330/207 A, 251; 341/101, 143
See application file for complete search history.

(56) References Cited

U.S. PATENT DOCUMENTS 6,696,891 B2* 2/2004 Noro et al. ............... 330/251

OTHER PUBLICATIONS

Eric Gaalaas, et al, "Integrated Stereo ΔΣ Class D Amplifier", IEEE Journal of Solid-State Circuits, vol. 40, No. 12, Dec. 2005; pp. 2388-2397.

* cited by examiner

*Primary Examiner*—Khanh V Nguyen
(74) *Attorney, Agent, or Firm*—Garlick Harrison & Markison; Timothy W. Markison

(57) ABSTRACT

A class-D amplifier includes a switching transistor section, a filter, an analog to digital converter, and a feedback module. The switching transistor section is operably coupled to convert a serial input into a switched output signal. The filter is operably coupled to filter the switched output signal to produce an output of the class-D amplifier. The analog to digital converter is operably coupled to convert an analog input into a multi-bit digital signal based on a feedback signal, wherein the serial input corresponds to the multi-bit digital signal. The feedback module is operably coupled to the produce the feedback signal based on at least one varying property of the switching transistor section.

9 Claims, 4 Drawing Sheets multi-function handheld device 10 class-D Amplifier 70 feedback module 122

CLASS-D AMPLIFIER WITH NOISE-IMMUNITY FEEDBACK

This patent application is claiming priority under 35 USC § 119 to a provisionally filed patent application entitled CLASS-D AMPLIFIER WITH NOISE-IMMUNITY FEEDBACK, having a provisional filing date of Jan. 13, 2005, and a provisional Ser. No. 60/643,543.

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally signal processing, and more particularly to class-D amplifiers.

2. Description of Related Art

Integrated circuits are used in a wide variety of electronic equipment, including portable, or handheld, devices. Such handheld devices may include personal digital assistants ("PDA"), compact disc players, MPEG-1 Layer 3 digital audio ("MP3") players, digital video disc players, AM/FM radio, a pager, cellular telephones, computer memory extension (commonly referred to as a thumb drive), etc. For example, an MP3 player may include one or more integrated circuits to support the storage and playback of digitally formatted audio (e.g., formatted in accordance with an MP3 specification), to interface with a computer, to generate a power supply voltage, and to render digitally formatted audio data audible.

The rendering of digitally formatted audio data into audible signals involves decoding the formatted audio data into digital audio signals, converting the digital audio signals into analog audio signals, and amplifying the analog audio signals. To provide a desired level of amplification, power efficiency, and compact size, class-D amplifiers are typically used to amplify the analog audio signals. While class-D amplifiers exhibit these positive characteristics, total harmonic distortion ("THD") of a class-D amplifier varies with load, temperature, and/or other operating parameters.

As such, to provide high quality amplification of audio signals, the THD of class-D amplifiers needs to be compensated. There are a variety of techniques for THD compensation, but such techniques are generally static and do not effectively compensate noise introduced on the power supply. For instance, a static solution generates a calibration value at the start up the amplifier, where the calibration value is based on the start up impedances of the switching transistors and the start up inductor current. Thus, as the impedances of the switching transistors and the inductor current vary over time and temperature, the statically determined calibration value is less than optimal for compensating THD. In addition, the static solution does not account for transient noise and/or power supply noise.

Therefore, a need exists for a dynamic method and apparatus to minimize and/or compensate THD, transient noise, and/or power supply noise, of class-D amplifiers.

BRIEF DESCRIPTION OF THE SEVERAL VIEWS OF THE DRAWING(S)

DETAILED DESCRIPTION OF THE INVENTION

Figure 1:
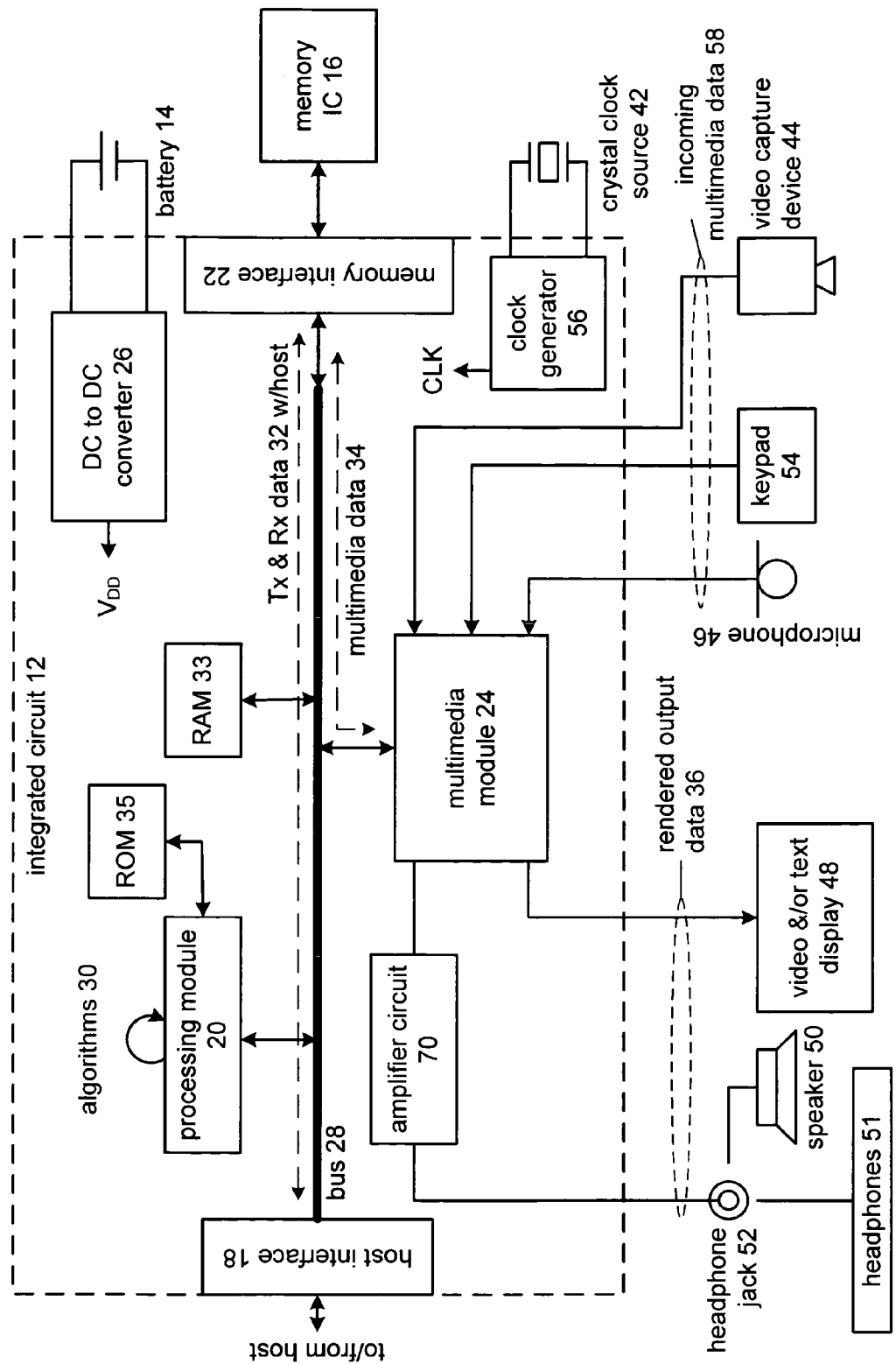
FIG. 1 is a schematic block diagram of a handheld device in accordance with the present invention.

FIG. 1 is a schematic block diagram of a handheld device 10 that includes an integrated circuit 12, a battery 14, memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The integrated circuit 12 includes a host interface 18, a processing module 20, a memory interface 22, a multimedia module 24, a DC-to-DC converter 26, an amplifier circuit 70, and a clock generator 56, which produces a clock signal (CLK) for use by the other modules. As one of ordinary skill in the art will appreciate, the clock signal CLK may include multiple synchronized clock signals at varying rates for the various operations of the multi-function handheld device.

When the multi-function handheld device 10 is operably coupled to a host device, which may be a personal computer, workstation, server, a laptop computer, a personal digital assistant, and/or any other device that may transceive data with the multi-function handheld device, the processing module 20 performs at least one algorithm 30 where the corresponding operational instructions of the algorithm 30 are stored in memory 16, ROM 35, RAM 33, and/or other memory that may be included and/or coupled to the integrated circuit 12. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

When the multi-function handheld device 10 is in the first functional mode, the integrated circuit 12 facilitates the transfer of data between a host device and memory 16, which may be non-volatile memory (e.g., flash memory, disk memory, SDRAM) and/or volatile memory (e.g., DRAM). In one embodiment, the memory IC 16 is a NAND flash memory that stores both data and the operational instructions of at least a portion of one of the algorithms 30.

In this mode, the processing module 20 retrieves a first set of operational instructions (e.g., a file system algorithm, which is known in the art) from the memory 16 to coordinate the transfer of data. For example, data received from the host device (e.g., Rx data) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided, via the memory interface 22, to memory 16 for storage. In this mode, the handheld device 10 is functioning as extended memory of the host device (e.g., like a thumb drive).

In furtherance of the first functional mode, the host device may retrieve data (e.g., Tx data) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, Firewire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder.

As one of average skill in the art will appreciate, the data stored in memory 16, which may have 64 Mbytes or of greater storage capacity, may be text files, presentation files, user profile information for access to varies computer services (e.g., Internet access, email, etc.), digital audio files (e.g., MP3 files, WMA—Windows Media Architecture-, MP3 PRO, Ogg Vorbis, AAC—Advanced Audio Coding), digital video files [e.g., still images or motion video such as MPEG (motion picture expert group) files, JPEG (joint photographic expert group) files, etc.], address book information, and/or any other type of information that may be stored in a digital format. As one of average skill in the art will further appreciate, when the handheld device 10 is coupled to the host device, the host device may power the handheld device 10 such that the battery is unused.

When the handheld device 10 is not coupled to the host device, the processing module 20 executes an algorithm 30 to detect the disconnection and to place the handheld device in a second operational mode. In the second operational mode, the processing module 20 retrieves, and subsequently executes, a second set of operational instructions from memory 16 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into audio signals and provides them to the amplifier circuit 70. The amplifier circuit 70, which will be described in greater detail with reference to FIGS. 2-5, may include one or more amplifiers, such as a class-D amplifier, to provide amplified analog output signals to a headphone jack 52 or other audio output. The headphone jack may be coupled to a headphone 51 or to a speaker 52. In addition, or in the alternative, the multimedia module 24 may render digital video data and/or digital text data into RGB (red-green-blue), YUV, etc., data for display on an LCD (liquid crystal display) monitor, projection CRT, and/or on a plasma type display (e.g., display 48).

The handheld device 10 may further store digital information received via one of the multimedia input devices 44, 46, and 54 when in the first operational mode. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

The handheld device 10 may further function to record and/or playback multimedia data stored in the memory 16 when in the second operational mode (i.e., not connected to the host). Note that the data provided by the host when the handheld device 40 was in the first operational mode includes the multimedia data. In this embodiment, depending on the type of multimedia data 34, the rendered output data 36 may be provided to one or more of the multimedia output devices.

For example, rendered audio data may be provided to the headphone jack 52, while rendered video and/or text data may be provided to the display 48.

The handheld device 10 may also record multimedia data 34 while in the second operational mode. For example, the handheld device 10 may store digital information received via one of the multimedia input devices 44, 46, and 54.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
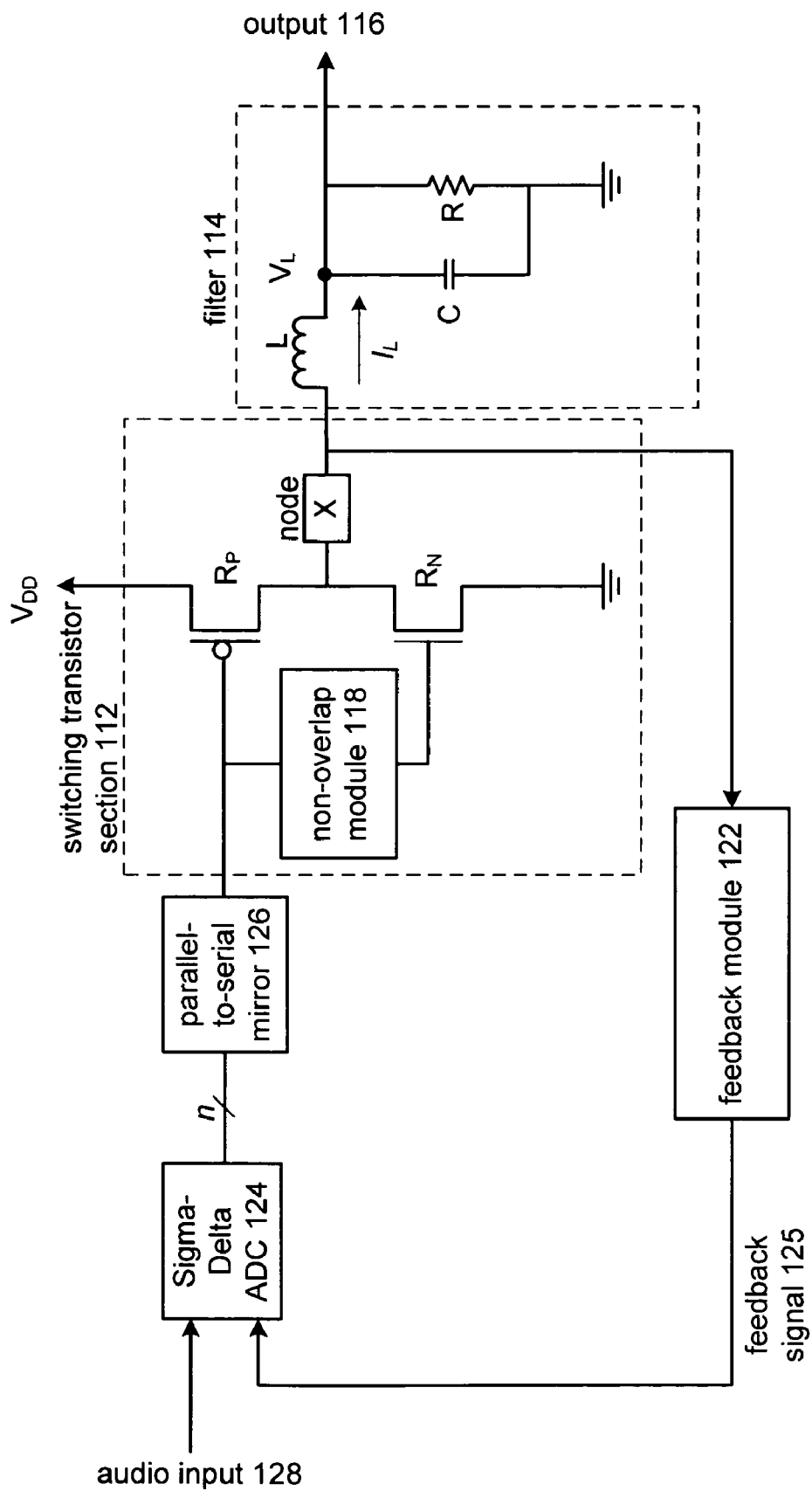
FIG. 2 is a schematic block diagram of a class-D amplifier having components to minimize THD and power supply noise in accordance with the present invention.

FIG. 2 illustrates a schematic block diagram of a class-D amplifier 70 that may be used within the handheld device 10 of FIG. 1, as a stand-alone amplifier, or in any circuit requiring a class-D amplifier. The class-D amplifier includes a sigma-delta analog to digital converter (ADC) 124, a parallel to serial module 126, a switching transistor section 112, a filter 114, and a feedback module 122. The switching transistor section 112 includes a P-channel transistor Rp, an N-channel transistor Rn, and a non-overlap module 118. Note that the serial connection between the N and P channel transistors provides a node (node X) that provides the output of the switching transistor section 112. The filter 114 includes an inductor L, a capacitor C, and a resistor R.

In operation, the sigma-delta ADC 124 converts an analog input, which may be an audio input 128, into a digital signal based on a feedback signal 125. The feedback module 122 produces the feedback signal 125 to vary such that it compensates for imperfections of the switching transistor section 112 components, transient noise, and/or power supply noise thereby reducing THD and/or noise caused by transients and the power supply. The feedback module will be described in greater detail with reference to FIG. 5.

Figure 3:
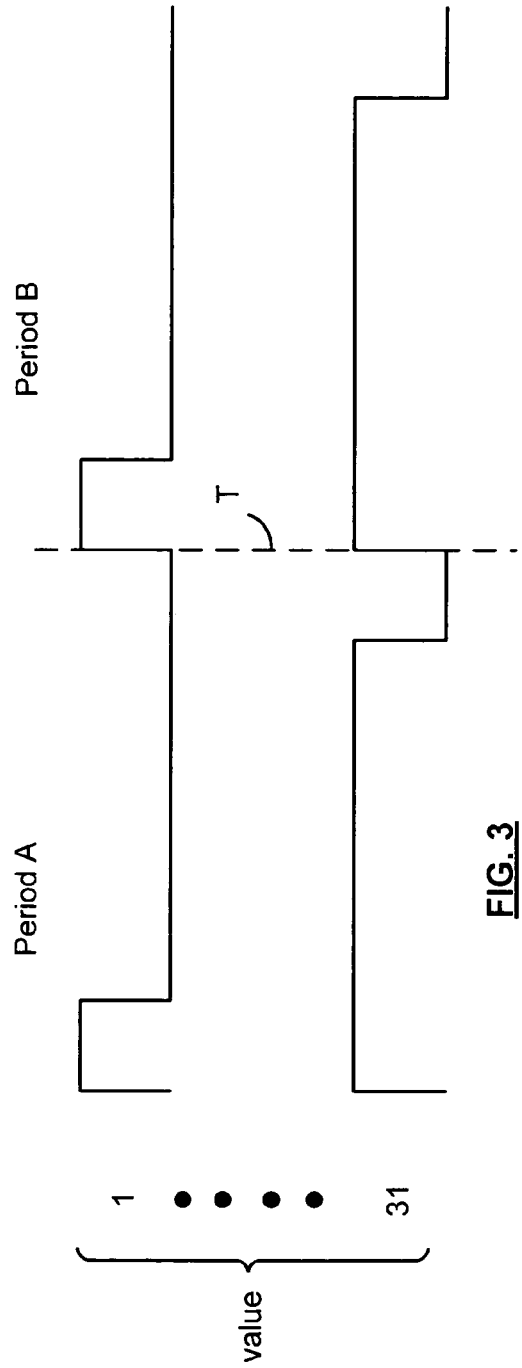
FIG. 3 is a diagram of an off "center mass" waveform of a parallel-to-serial module in accordance with the present invention.

In one embodiment, the ADC 124 produces a multiple bit digital signal that the parallel to serial module 126 converts into a serial signal. The serial signal may be an off center mass signal for a given period or a more centered mass signal over two or more periods. For example, FIG. 3 illustrates an off center mass serial input produced in response to a five bit digital value. If the center mass of the signal is assumed to be the time boundary between period A and period B, one can see how the signals are off center mass. As such, the switching transistor section is switching up and down for every 5-bit digital value. In a preferred embodiment, the parallel to serial module 126 further functions to generate a mirrored serial signal as shown in FIG. 4.

Figure 4:
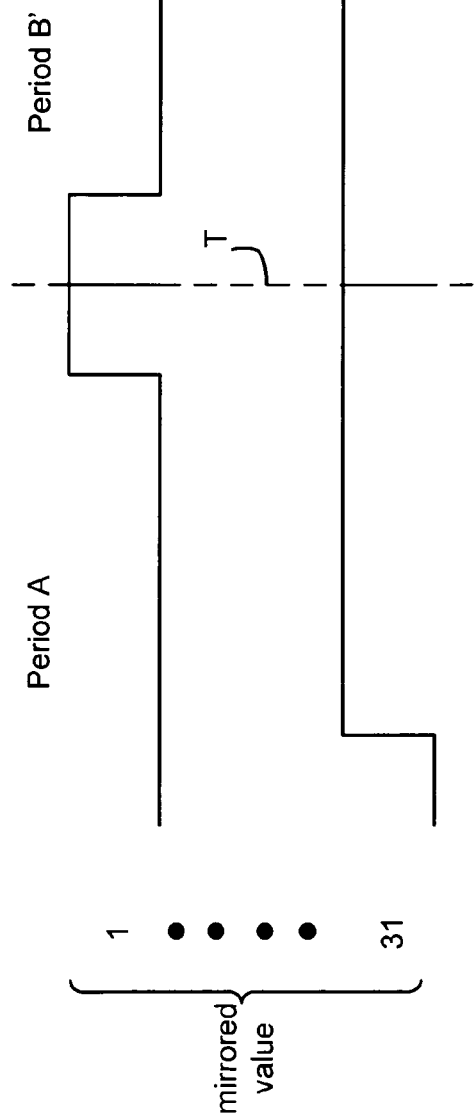
FIG. 4 is a diagram of a mirrored output waveform of a parallel-to-serial module in accordance with the present invention.

As shown in FIG. 4, the serial signal is centered about the hashed line for periods A and B. In this manner, the switching transistor section switches up and down only once for every two periods. In this manner and in comparison to FIG. 3, less noise is generated and at a lower frequency thereby improving noise immunity of the amplifier 70.

Returning to the discussion of FIG. 2, the switching module 112 receives the serial input from the parallel to serial module 112 and produces an output at node X, therefrom. The serial input is a binary signal that causes transistor Rp to be on and transistor Rn to be off or transistor Rn to be on and transistor Rp to be off. For example, when the serial input signal is low, transistor Rp is on and transistor Rn is off. Conversely, when the serial input is high, transistor Rn is on and transistor Rp is off. The non-overlap circuit 118 provides delay in enabling and disabling transistor Rn and Rp such that both transistors are not fully on at the same time.

The filter 114 converts the signal at node X into an amplified output signal 116. In an ideal implementation, when transistor Rp is on and transistor Rn is off, node X is pulled to $V_{DD}$ and when transistor Rn is on and transistor Rp is off, node X is pulled to ground. However, transistors Rp and Rn and $V_{DD}$ are not perfect. As is known, over temperature, time, and process, the characteristics (e.g., transconductance, on-resistance, etc.) of N channel and P channel transistors change. As is also known, $V_{DD}$ is not an ideal source (i.e., a steady DC voltage with no AC component) since load variations cause noise on $V_{DD}$. As such, $V_{DD}$ includes varying AC components attributable to noise. Thus, the signal at node X includes the imperfections of the transistors Rp and Rn and the imperfections of the supply voltage $V_{DD}$.

As one of ordinary skill in the art will appreciate, the class-D amplifier of FIG. 2 may be completely implemented on an integrated circuit, completely off-chip, or a combination thereof. For example, the ADC 124, the parallel to serial module 126, the switching transistor section 112, and the feedback module 122 may be on-chip while the filter 114 may be off-chip.

Figure 5:
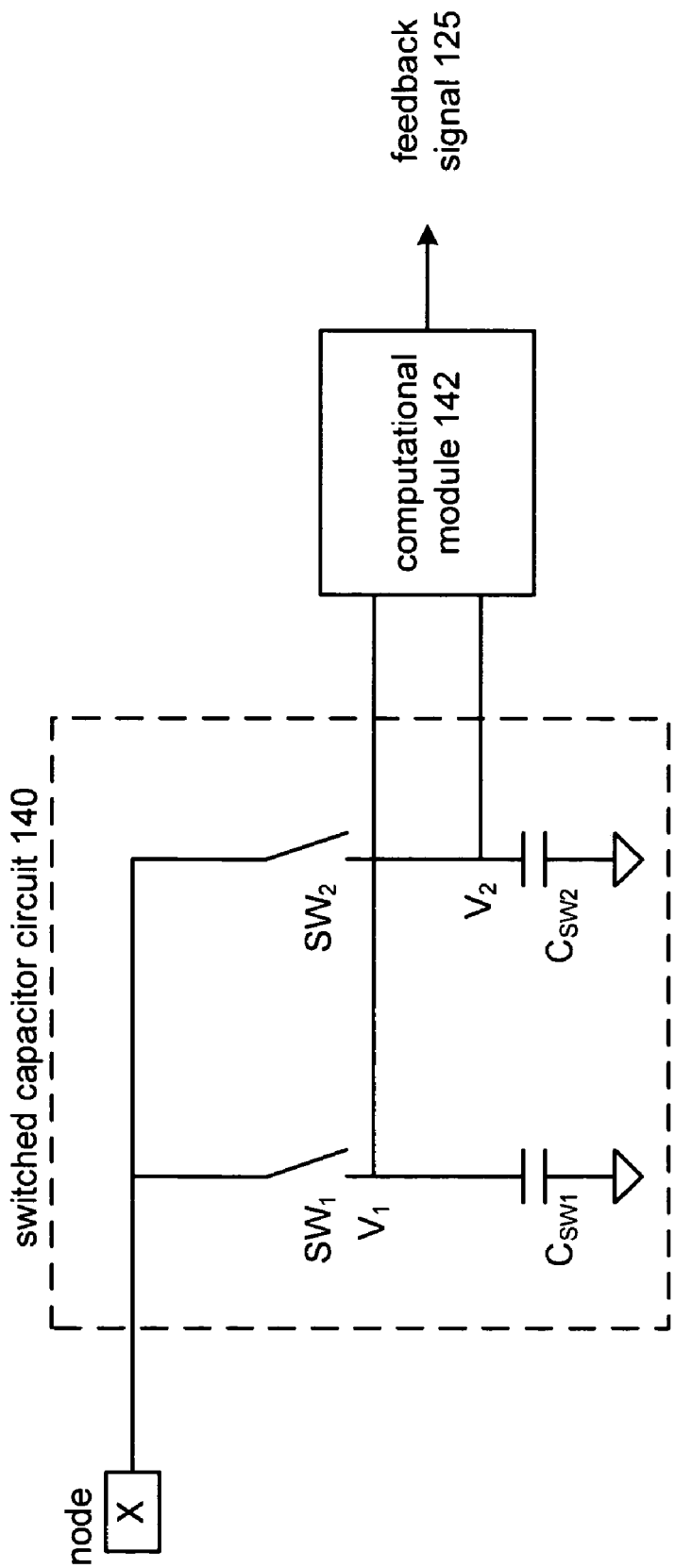
FIG. 5 is a schematic block diagram of a feedback module in accordance with the present invention.

FIG. 5 is a schematic block diagram of an embodiment of the feedback module 122 that generates the feedback signal 125 in the closed loop system to substantially compensate the adverse effects caused by the imperfections of the switching transistors Rn and Rp and the of the supply voltage. As shown, the feedback module 122 includes a switched capacitor circuit 140 and a computational module 142. The switched capacitor circuit 140 includes two capacitors $C_{SW1}$ and $C_{SW2}$ and two switches $S_{W1}$ and $S_{W2}$.

In operation, $S_{W1}$ is closed and $S_{W2}$ is open when transistor Rn is on and transistor Rp is off (i.e., when the serial input to the switching transistor section 112 is high). In this configuration, the capacitor $C_{SW1}$ is being charged to a voltage level $V_1$ that corresponds to the on-resistance of transistor Rn times the inductor current $I_L$. Written as an equation: $V_1 = Rn*I_L$.

When $S_{W1}$ is open and $S_{W2}$ is closed, which corresponds to when transistor Rn is off and transistor Rp is on (i.e., when the serial input to the switching transistor section 112 is low), the capacitor $C_{SW2}$ is being charged to a voltage level $V_2$ that corresponds to the supply voltage minus the on-resistance of transistor Rp times the inductor current $I_L$. Written as an equation:

$$V_2 = V_{DD} - Rp*I_L.$$

From these two values ($V_1$ and $V_2$), the computational module 142 generates the feedback signal 125. In one embodiment, the computational module 142 averages the two values to produce the feedback signal 125. For example, the computational module 142 adds $V_1$ and $V_2$ to obtain a sum, and then divides the sum by two. Written as an equation, feedback signal = ½($V_1 + V_2$). Substituting from the above equations, the feedback signal = ½($Rn*I_L + V_{DD} - Rp*I_L$) = ½[$V_{DD} + I_L(Rn - Rp)$]. As one of ordinary skill in the art will appreciate, other computations on V1 and V2 may be performed to obtain the feedback signal, such as a common mode determination, RMS determination, etc. As one of ordinary skill in the art will further appreciate, other circuitry may be used to capture V1 and V2, such as a single capacitor, sample and hold circuits, registers, etc.

With the feedback signal 125 including dynamic representations of the imperfections of the transistors and the supply voltage, the ADC includes the inverse of these imperfections during the analog to digital conversion process. The parallel to serial module 126 converts the multi-bit digital signals that include the inverse imperfections into a serial input that includes the inverse imperfections. When the switching transistor section that includes the imperfections processes the serial input with the inverse imperfections the resulting signal at node X is a representation of the serial input without the imperfections. As such, a dynamic method and apparatus to minimize and/or compensate THD, transient noise, and/or power supply noise, of class-D amplifiers.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "operably associated with", as may be used herein, includes direct and/or indirect coupling of separate components and/or one component being embedded within another component. As one of ordinary skill in the art will still further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The preceding discussion has presented various embodiments of a class-D that has reduced THD and adverse operation from transient noise and/or power supply noise. As one of ordinary skill in the art will appreciate, other embodiments may be derived from the teachings of the present invention without deviating from the scope of the claims.

What is claimed is:

1. A class-D amplifier comprises:
   a switching transistor section operably coupled to convert a serial input into a switched output signal;
   a filter operably coupled to filter the switched output signal to produce an output of the class-D amplifier;
   an analog to digital converter operably coupled to convert an analog input into a multi-bit digital signal based on a feedback signal, wherein the serial input corresponds to the multi-bit digital signal; and
   a feedback module operably coupled to the produce the feedback signal based on at least one varying property of the switching transistor section wherein the feedback module produces the feedback signal by:
      measuring a first voltage of the switched output signal when the serial input is in a first state;
      measuring a second voltage of the switched output signal when the serial input is in a second state; and
      determining the feedback signal based on the first and second voltage.

2. The class-D amplifier of claim 1 further comprises:
   a parallel to serial module operably coupled to convert the multiple bit digital signal into the serial signal.

3. The class-D amplifier of claim 2, wherein the parallel to serial module comprises:
   a parallel to serial mirror module operably coupled to establish a center mass of consecutive multiple bit digital values of the multiple bit digital signal as the serial input.

4. The class-D amplifier of claim 1 further comprises:
   equating the first voltage to a supply voltage minus impedance of a first transistor of the switching transistor section times a current provided to the filter;
   equating the second voltage to impedance of a second transistor of the switching transistor section times the current; and
   determining the feedback signal as a fraction of the first voltage plus the second voltage, wherein the at least one varying property of the switching transistor section includes at least one of: the supply voltage, the impedance of the first transistor and the impedance of the second transistor.

5. The class-D amplifier of claim 1, wherein the filter comprises:
   an inductor operably coupled to receive the switched output signal;
   a resistor; and
   a capacitor coupled to the resistor, wherein combination of the capacitor and the resistor is coupled in series with the inductor to provide the output of the class-D amplifier.

6. A class-D amplifier comprises:
   a switching transistor section operably coupled to convert a serial input into a switched output signal;
   a filter operably coupled to filter the switched output signal to produce an output of the class-D amplifier;
   an analog to digital converter operably coupled to convert an analog input into a multiple bit digital signal; and
   a parallel to serial mirror module operably coupled to establish a center mass of consecutive multiple bit digital values of the multiple bit digital signal to produce the serial input.

7. The class-D amplifier of claim 6 further comprises:
   the analog to digital converter converting the analog input into the multiple bit digital signal based on a feedback signal; and
   a feedback module operably coupled to:
      measure a first voltage of the switched output signal when the serial input is in a first state;
      measure a second voltage of the switched output signal when the serial input is in a second state; and
      determining the feedback signal based on the first and second voltage.

8. The class-D amplifier of claim 7 further comprises:
   equating the first voltage to a supply voltage minus impedance of a first transistor of the switching transistor section times a current provided to the filter;

equating the second voltage to impedance of a second transistor of the switching transistor section times the current; and determining the feedback signal as a fraction of the first voltage plus the second voltage, wherein the at least one varying property of the switching transistor section includes at least one of: the supply voltage, the impedance of the first transistor and the impedance of the second transistor.

9. The class-D amplifier of claim 6, wherein the filter comprises:
   an inductor operably coupled to receive the switched output signal;
   a resistor; and
   a capacitor coupled to the resistor, wherein combination of the capacitor and the resistor is coupled in series with the inductor to provide the output of the class-D amplifier.

* * * * *